United States Patent
Saito et al.

[11] Patent Number: 5,612,548
[45] Date of Patent: Mar. 18, 1997

[54] DIAMOND LIGHT-EMITTING ELEMENT

[75] Inventors: Kimitsugu Saito; Koichi Miyata, both of Kobe, Japan

[73] Assignee: Kabushiki Kaisha Kobe Seiko Sho, Kobe, Japan

[21] Appl. No.: 598,618

[22] Filed: Feb. 12, 1996

Related U.S. Application Data

[63] Continuation of Ser. No. 400,872, Mar. 8, 1995, abandoned.

[30] Foreign Application Priority Data

Apr. 7, 1994 [JP] Japan ................................. 6-069201

[51] Int. Cl.$^6$ .............................................. H01L 31/0312
[52] U.S. Cl. .............................. 257/77; 257/101; 257/102; 257/103; 257/607
[58] Field of Search .............................. 257/77, 87, 101, 257/102, 103, 607

[56] References Cited

U.S. PATENT DOCUMENTS 5,252,840  10/1993  Shiomi et al. .......................... 257/77

*Primary Examiner*—Minhloan Tran
*Attorney, Agent, or Firm*—Oblon, Spivak, McClelland, Maier & Neustadt, P.C.

[57] ABSTRACT

A diamond light-emitting element capable of intense light emission at low operation voltage. A conductive substrate is disposed on a metallic plate such as copper to form an ohmic contact. A first diamond layer is formed on the conductive substrate. The boron atom concentration in the first diamond layer is $10^{19}$ cm$^{-3}$ or higher. A second diamond layer is formed on the first diamond layer. The second diamond layer has a crystal defect density of $10^{11}$ cm$^{-2}$ or higher. A second electrode is formed on the second diamond layer. A power supply is connected to the second electrode and the copper plate. When voltage is applied, holes in the first diamond layer recombine with electrons from the second electrode, and hence light emission takes place. The defect levels in the second diamond layer form the recombination centers to achieve high brightness at low operation voltage.

7 Claims, 8 Drawing Sheets

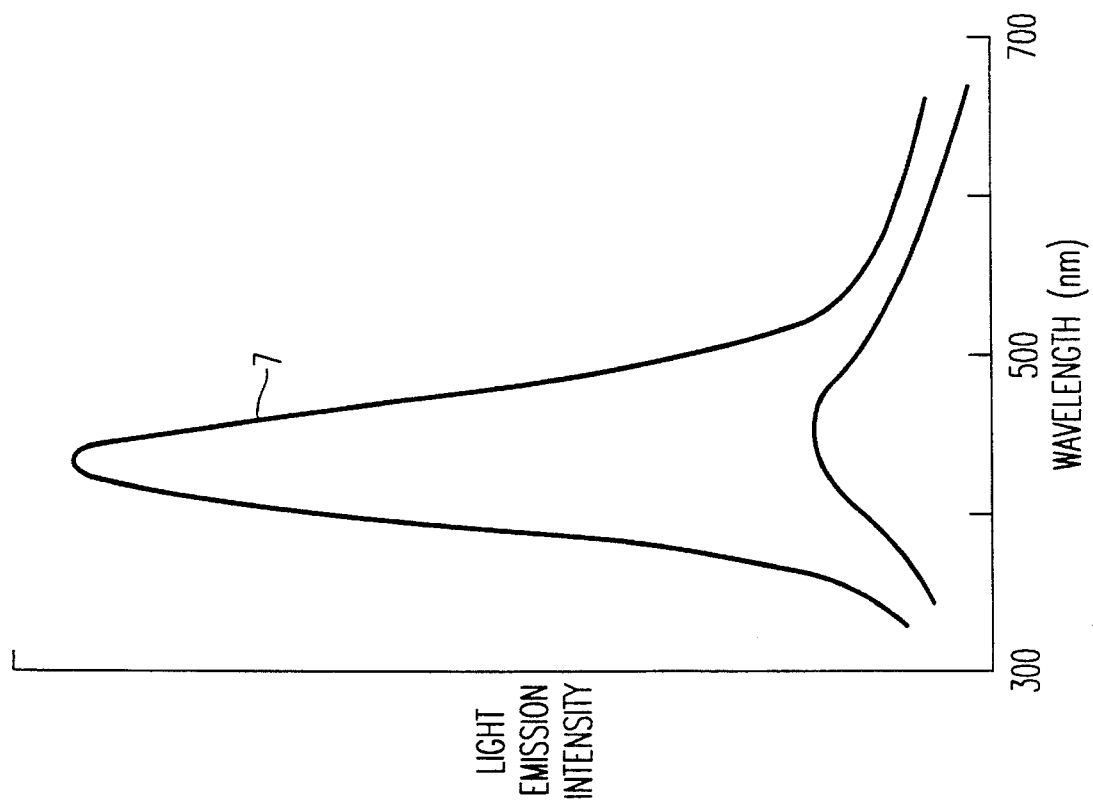
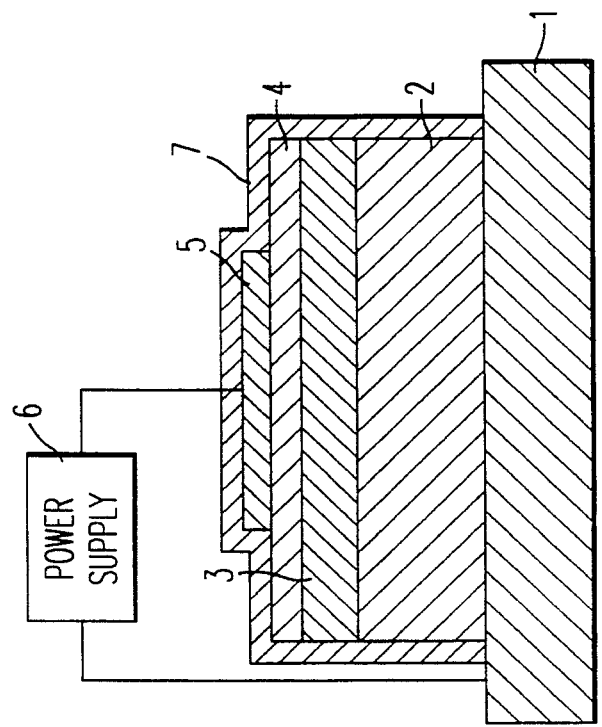

DIAMOND LIGHT-EMITTING ELEMENT

This application is a continuation of application Ser. No. 08/400,872, filed on Mar. 8, 1995, now abandoned.

BACKGROUND OF THE INVENTION

1. Field of the Invention

The present invention relates to a high brightness diamond light-emitting element using diamond as the light-emitting material.

2. Description of the Related Art

Diamond has a wide band gap of about 5.4 eV, and is capable of emitting a short wavelength light. Light-emitting elements using diamond have been studied as described below:

FIGS. 11 to 13 show prior art, electroluminescence (EL)-type light-emitting elements which are disclosed in Unexamined Japanese Patent Publication No. HEI 3-281594, wherein each of the light-emitting elements uses diamond as the light-emitting material. In FIG. 11, electrodes 52 are formed on the upper and lower surfaces of a diamond light-emitting layer 51. In FIG. 12, an electrode 52 is formed on the lower surface of a diamond light-emitting layer 51, an insulating layer 53 is formed on the upper surface of the light-emitting layer 51, and the electrode 52 is formed on the insulating layer 53.

In FIG. 13, insulating layers 53 are formed on both sides of a diamond light-emitting layer 51, and an electrodes 52 are formed on the insulating layers 53.

The above-described diamond light-emitting layers 51 are doped with an impurity such as N, B, Al, P, As, Sb, Ga or In to cause light emission.

In the light-emitting elements having such structures, the diamond layers 51 emit light when AC electric field is applied across the electrodes 52.

FIGS. 14 to 16 are cross sectional views of other prior art light-emitting elements, which are disclosed in Unexamined Japanese Patent Publication No. HEI 1-102893. FIG. 14 is a cross sectional view of a light-emitting element with an EL structure, where the light-emitting layer 54 is a semiconducting diamond doped with Al or B, and the entire surface of the semiconducting diamond light-emitting layer 54 is covered with an insulating layer 55. A metal electrode 56 is formed on the lower surface of the insulating layer 55, and a transparent electrode 57 is formed on the upper surface of the insulating layer 55. The semiconducting diamond layer 54 emits light when AC electric field is applied between the transparent electrode 57 and the metal electrode 56.

FIG. 15 is a cross sectional view of a light-emitting element having a metal electrode/semiconducting diamond (MS) structure. Here, a metal electrode 56 is formed in a specified area on the lower surface of a substrate 58. A semiconducting diamond light-emitting layer 54 is formed on the upper surface of the substrate 58. The other metal electrode 56 is formed in a specified area on the upper surface of the layer 54. The semiconducting diamond light-emitting layer 54 emits light when a forward current is allowed to flow between the metal electrodes 56. The light emission occurs by a mechanism that electrons are transported by way of donor levels and recombine with holes created by acceptors such as Al and B (carrier injection type).

FIG. 16 is a cross sectional view of a light-emitting element having a metal electrode/undoped intrinsic diamond/semiconducting diamond (MIS) structure. This is similar to the MS structure shown in FIG. 15, but an undoped intrinsic diamond layer 59 is sandwiched between the semiconducting diamond light-emitting layer 54 and the metal electrode 56.

In the MIS structure, the semiconducting diamond layer 54 emits light like the MS structure when a forward current is allowed to flow between the metal electrodes 56. The light emission occurs by the same mechanism as that described in the MS structure.

FIGS. 17 to 19 show cross sectional views of other prior art light-emitting elements, disclosed in Unexamined Japanese Patent Publication No. HEI 3-122093. In FIG. 17, a diamond light-emitting layer 61 is formed on a substrate 60, and a metal electrode 62 is selectively formed on the upper surface of the layer 61.

The light-emitting element shown in FIG. 18 is similar to that shown in FIG. 17, except that a low-resistance diamond layer 63 exists between the substrate 60 and the diamond layer 61.

The structure of the light-emitting element in FIG. 19 is different from that in FIG. 18 in that an insulating diamond layer 64 exists between the diamond layer 61 and the metal electrode 62.

The light-emitting elements shown in FIGS. 17 to 19 emit light when a forward current flows between the substrate 60 and the metal electrode 62. If the diamond layer 61 is doped with B, it emits a green light. On the other hand, if the diamond layer 61 is synthesized using a source gas which includes $O_2$ to introduce lattice defects in the diamond layer, it emits a red light. When the diamond layer 61 is synthesized using a source gas which includes $H_2O$ to introduce lattice defects, it emits a blue light.

FIG. 20 shows a cross sectional view of a light-emitting element disclosed in Unexamined Japanese Patent Publication No. HEI 3-222376. Here, a metal electrode 66 is selectively formed on the lower surface of a conductive substrate 65, and either p-type or n-type semiconducting diamond light-emitting element 67 is formed on the upper surface of the substrate 65. An undoped diamond film 68 is further formed on the upper surface of the semiconducting diamond layer 67, and finally a metal electrode 66 is selectively formed on the upper surface of the undoped diamond film 68.

When a forward voltage is applied between a pair of electrodes 66, the light-emitting element emits light because electrons recombine with holes by way of the defect levels in the semiconducting diamond layer 67.

The above-described prior art light-emitting elements have the following problems: the EL elements shown in FIGS. 11 to 14 require an operation voltage as high as 300 V, which is unsuitable for practical use.

In the light-emitting elements shown in FIGS. 15 and 16, the light emission depends on the density of the donor levels in the diamond layer 54 due to impurities such as N. However, the density of such doner levels is very low, and thus the brightness is limited.

For the light-emitting elements shown in FIGS. 17 to 20, the defect density is also limited and the brightness is low.

SUMMARY OF THE INVENTION

An object of the present invention is to provide a diamond light-emitting element capable of reducing the operation voltage and achieving a high brightness.

According to an aspect of the present invention, there is provided a diamond light-emitting element comprising: a first semiconducting diamond layer, a second semiconducting diamond layer deposited on the first semiconducting diamond layer, and first and second electrodes, attached to the first and second semiconducting diamond layers, respectively, wherein the second semiconducting diamond layer has a defect density of $10^{11}$ cm$^{-2}$ or higher.

The second semiconducting diamond layer is doped with at least one kind of impurities selected from a group consisting of B, Li, Be, O, F, P, Si, N, As and Al. The thickness of the second semiconducting diamond layer is preferably in the range between 0.01 and 100 µm.

The first semiconducting diamond layer contains $10^{19}$ cm$^{-3}$ or more B.

The first electrode is ohmic contact with the first semiconducting diamond layer.

The first semiconducting diamond layer is formed on a conductive substrate, and the first electrode is constituted of the conductive substrate.

The first and second semiconducting diamond layers and the first and second electrodes are partially or entirely covered with a single or multiple structure insulating protective layer formed of at least one kind of materials selected from a group consisting of an undoped diamond, silicon oxide, aluminum oxide, boron nitride, silicon nitride and aluminum nitride.

In the diamond light-emitting element of the present invention, since the second diamond layer is adjacent to the first semiconducting diamond layer, carriers (holes) can be injected from the first diamond layer to the second diamond layer without a potential barrier.

When a voltage is applied between the first and second electrodes and a current flows from the first to the second diamond layer, holes move from the first to the second diamond layer, while electrons move from the second electrode to the second diamond layer. The injected holes recombine with the electrons at the defect levels in the second diamond layer and emit light. The light-emitting elements of the present invention are a carrier injection type, and do not require a high voltage unlike the EL elements, but they can emit light with a high brightness by a low operation voltage. The operation voltage is usually on the order of 10 V and no higher than 1000 V, although it depends on the operation method. The power supply may be alternate current (AC), direct current (DC) or a combination of AC and DC.

The diamond light-emitting element of the present invention is different from the prior arts in that crystal defects are intentionally introduced in the second diamond layer in which the defect density is $10^{11}$ cm$^{-2}$ or higher. When a voltage is applied, holes in the first diamond layer and electrons in the second electrode are transported to recombine with each other. Since it is defects that contribute to the recombination of holes and electrons, the density of defects is required to be $10^{11}$ cm$^{-2}$ or higher.

BRIEF DESCRIPTION OF THE DRAWINGS

FIG. 1 is a cross sectional view of a diamond light-emitting element according to Inventive Example 1;

FIG. 2 is a graph showing the light emission spectra of diamond light-emitting elements in Inventive Example 1 and Comparative Example 1;

DETAILED DESCRIPTION OF THE PREFERRED EMBODIMENTS

Figure 4:
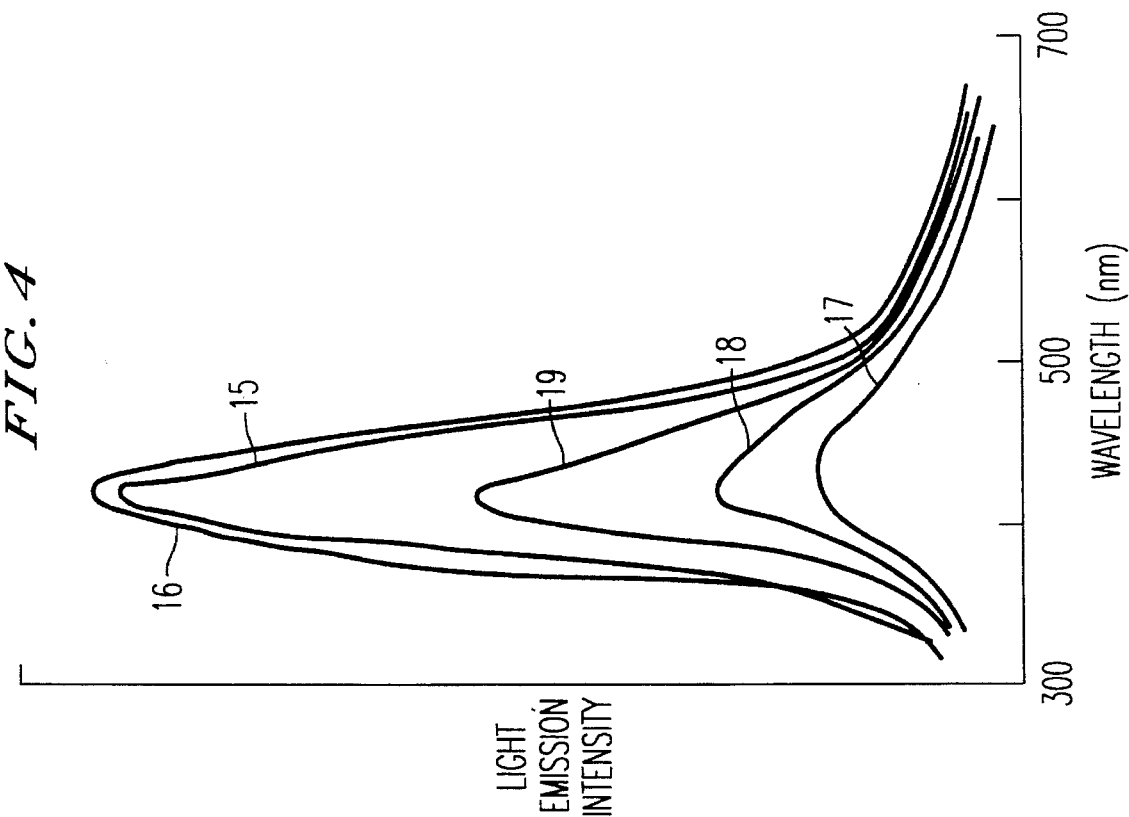
FIG. 4 is a graph showing the light emission spectra of diamond light-emitting elements in Inventive Examples 2 and 3, and Comparative Examples 3, 4 and 5.

As described above, the second diamond layer of the light-emitting element in the present invention has a crystal defect density of $10^{11}$ cm$^{-2}$ or higher. The second diamond layer can be formed by known vapor-phase synthetic methods such as microwave plasma chemical vapor-phase deposition (CVD), electron cyclotron resonance (ECR) plasma CVD, DC plasma CVD, radio frequency (RF) plasma CVD, DC plasma jet CVD, thermal filament CVD, electron bombardment CVD, and combustion. Either method can be used under the conditions that the second diamond layer has a density of crystal defects of $10^{11}$ cm$^{-2}$ or higher.

Introduction of the crystal defects can be done by increasing the concentration of the carbon (C) containing gas in the source gas for the synthesis of the second diamond layer. For the carbon containing gas, one can use hydrocarbon such as methane, ethane, or propane, or alcohol such as methanol or ethanol, or other gases such as carbon dioxide or carbon monoxide.

Crystal defects can also be introduced by adding a gas containing at least one kind of impurities selected from the group consisting of B, Li, Be, O, F, P, Si, N, As and Al in a source gas for the synthesis of the second diamond layer. It should be noted that by doping B together with other impurities in the second diamond layer, acceptor levels are formed in addition to defect levels. This makes it possible to control the spectrum of the light emission.

The thickness of the second diamond layer is preferably in the range from 0.01 to 100 µm. When it is less than 0.01 µm, carriers can travel freely between the second electrode and the first diamond layer due to tunneling effect, reducing the light emission efficiency. On the other hand, when it is greater than 100 µm, the serial resistance is too high and the current is too small, resulting in a lower brightness.

By contrast, if the first semiconducting diamond layer contains $10^{19}$ cm$^{-3}$ or more B, a large current is allowed to flow in the second diamond layer, thereby further enhancing the brightness. Like the second diamond layer, the first diamond layer can be formed by the known vapor-phase synthesis methods. In this case, a mixed gas of carbon (C)

containing gas, boron (B) containing gas and hydrogen gas is used as the source gas.

The first diamond layer may be formed on a diamond substrate by ion implantation of B. In this case, the B atom concentration is required to be $10^{19}$ cm$^{-3}$ or higher, so that a large current is allowed to flow in the second diamond layer to enhance the brightness.

The first electrode may be the conductive substrate on which the first diamond layer is formed.

When the diamond light-emitting element is used in a corrosive environment such as at high temperature, a protective coating 7, as shown in FIG. 1, is required. In this case, an insulating protective film 7 is formed of at least one kind of materials selected from a group consisting of an undoped diamond, silicon oxide, aluminum oxide, silicon nitride, aluminum nitride and boron nitride. It may be formed of a single layer film of one kind of these materials or a multi-layer film of a plurality of these materials.

In view of thermal expansion and interface characteristics between the diamond light-emitting element and the protective film, it is desirable to use undoped diamond film on which silicon nitride film is formed, or a multi-layer of undoped diamond film, silicon nitride film, and a silicon oxide film as the protective film.

The present invention may be more clearly understood with the aid of the following examples. FIG. 1 is a cross sectional view of a diamond light-emitting element according to Inventive Example 1. A conductive substrate 2 is disposed on a copper plate 1, and the first diamond layer 3 and the second diamond layer 4 are sequentially deposited on the conductive substrate 2. A transparent electrode 5 is selectively formed on the second diamond layer 4. A power supply 6 is disposed between the transparent electrode 5 and the copper plate 1. Covering the diamond light-emitting element is the protective coating 7.

In the following, a method of fabricating a light-emitting element is described: A single crystal Si substrate having a resistivity of about 0.01 Ω·cm was used as a conductive substrate 2. The upper surface of the substrate 2 was abraded for about 1 hr by a diamond paste. The first diamond layer 3 was deposited on the substrate 2. The first diamond layer 3 was p-type semiconducting, and was vapor-phase synthesized by microwave CVD under the following synthetic conditions.

Source gas; CH$_4$ concentration: 0.5%,
B$_2$H$_6$ concentration: 2 ppm, and
H$_2$
Substrate temperature: 800° C.
Gas pressure: 35 Torr
Deposition time: 14 hours
Film thickness: 3 μm
Doping concentration: $10^{20}$ cm$^{-3}$ (measured by SIMS)

The second diamond layer 4 was synthesized on the first diamond layer 3 by microwave CVD under the following conditions:

Source gas; CH$_4$ concentration: 0.5%,
NH$_3$ concentration: 0.1 ppm,
B$_2$H$_6$ concentration: 0.01 ppm, and
H$_2$
Substrate temperature: 800° C.
Gas pressure: 35 Torr
Deposition time: 2 hours
Film thickness: 0.5 μm The upper surface of the second diamond layer 4 was cleaned using a mixed solution of chromic acid and concentrated sulfuric acid, followed by a cleaning by aqua regia, and was subjected a RCA cleaning.

The transparent electrode 5 made of indium-tin-oxide (ITO) was formed on the second diamond layer 4 by sputtering. It was patterned in a circular shape with a diameter of 3 mm by photolithography. The material of the transparent electrode 5 can be SnO$_2$, ZnO, SnO$_2$Sb, Cd$_2$SnO$_4$ and the like.

Finally, the sample was disposed on the copper plate 1 to make an ohmic-contact by Ag paste.

A diamond light-emitting element in Comparative Example 1 was prepared in a similar manner as Inventive Example 1. The light emission spectrum of these diamond light-emitting elements were measured by applying a negative bias of 40 V.

FIG. 2 is the light emission spectra of these diamond light-emitting elements, wherein the abscissa designates the wavelength and the ordinate designates the light emission intensity. The curve 7 corresponds to the spectrum of Inventive Example 1; while the curve 8 indicates the spectrum of Comparative Example 1.

As is apparent from FIG. 2, the light emission intensity of the diamond light-emitting element of Inventive Example 1 is more than 10 times greater than that of the diamond light-emitting element of Comparative Example 1.

Figure 3:
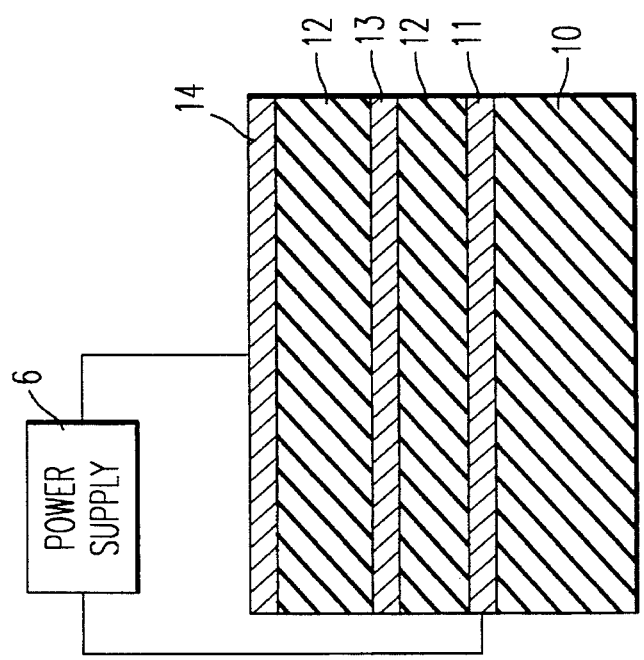
FIG. 3 is a cross sectional view showing a diamond light-emitting element of Comparative Example 2.

An EL element was fabricated in a similar manner as Comparative Example 2. The cross sectional view is shown in FIG. 3. The EL element was formed on a substrate 10 made of quartz. A transparent electrode 11 and an insulating layer 12 were successively formed on the substrate 10. The insulating layer 12 was made of silicon oxide. A diamond layer 13, formed on the insulating layer 12, was deposited under the same condition as that of the second diamond layer 4 of the diamond light-emitting element according to Inventive Example 1. The insulating layer 12 and an Al electrode 14 were formed on the diamond layer 13.

A power supply was connected between the transparent electrode 11 and the Al electrode 14 of the diamond light-emitting element thus fabricated, and an AC voltage of 250 V with a frequency of 50 Hz was applied. It was found that the emission intensity of the light-emitting element in Comparative Example 2 was only half that of the diamond light-emitting element of Inventive Example 1. Thus, the diamond light-emitting element of Inventive Example 1 achieved a higher brightness at lower voltage as compared with the EL element (FIG. 3).

In order to study the effect of the crystal defects density of the second diamond layer on the light emission intensity, five kinds of diamond light-emitting elements (Inventive Examples 2 and 3, and Comparative Examples 3, 4 and 5 in Table 1) were prepared. The structures of these elements were the same as that shown in FIG. 1. In the vapor-phase synthesis of the second diamond layers in Inventive Examples 2, 3 and Comparative Examples 3, 4 and 5, NH$_3$ was added to the source gas, where the concentrations of NH$_3$ were different as shown in Table 1.

Transmission electron microscopy (TEM) measurements were done to determine the defect densities in the second diamond layers 4 in Inventive Examples 2 and 3, and Comparative Examples 3, 4 and 5. The results are shown in Table 1.

TABLE 1

|  | | Concentration of $NH_3$ (ppm) | Defect Density $(cm^{-2})$ |
|---|---|---|---|
| Comparative Example | 3 | 0 | $7 \times 10^9$ |
|  | 4 | 0.002 | $8 \times 10^9$ |
|  | 5 | 0.005 | $5 \times 10^{10}$ |
| Inventive Example | 2 | 0.01 | $1 \times 10^{11}$ |
|  | 3 | 0.1 | $6 \times 10^{11}$ |

The light emission intensity was measured by applying a negative voltage of 40 V to the transparent electrode 5. The measured results are shown in FIG. 4. The curves 15 to 19 show the light emission spectra of Inventive Examples 2 and 3, and Comparative Examples 3, and 5, respectively.

As is apparent from this figure, better light emission intensities were obtained for Inventive Examples 2 and 3. This result indicates that the defect density of $10^{11}$ $cm^{-2}$ or higher in the second diamond layer, and 0.01 ppm or more $NH_3$ are necessary for the deposition of the second diamond layer.

For the case that at least one kind selected from a group consisting of Li, Be, O, F, P, Si, As and Al was doped, the defect density of the second diamond layer was $10^{11}$ $cm^{-2}$ or higher, and more intense light emission was obtained.

For the case that the concentration of carbon atom in the source gas was changed without introducing impurity gas in the vapor-phase synthesis of the second diamond layer, a high brightness was obtained from the diamond light-emitting elements when the defect density of the second diamond layer was $10^{11}$ $cm^{-2}$ or higher.

In summary, to fabricate a high brightness diamond light-emitting element, it is necessary to introduce a defect density of $10^{11}$ $cm^{-2}$ or higher in the second diamond layer.

In the following, effect of the B atom concentration in the first diamond layer on the light emission intensity is described: In Inventive Example 1, the concentration of $B_2H_6$ in the source gas used in the vapor-phase synthesis of the first diamond layer 3 was changed as shown in Table 2. The five diamond light-emitting elements 4–8 (Inventive Examples 7 to 11) have the same structure as shown in FIG. 1. The light-emitting spectra of the elements in Inventive Examples 7 to 9 were measured by applying a negative bias of 40 V to the transparent electrode 5.

TABLE 2

|  | | Concentration of $B_2H_6$ (ppm) | Concentration of B atoms $(cm^{-3})$ |
|---|---|---|---|
| Inventive Example | 4 | 0.05 | $4 \times 10^{17}$ |
|  | 5 | 0.1 | $8 \times 10^{17}$ |
|  | 6 | 0.5 | $3 \times 10^{18}$ |
|  | 7 | 1.0 | $1 \times 10^{19}$ |
|  | 8 | 2.0 | $1 \times 10^{20}$ |

As a result, it was found that Inventive Examples 7 and 8 showed higher light emission intensities than Inventive Examples 4 to 6. Therefore, addition of $B_2H_6$ gas of 1.0 ppm or more is necessary to synthesize the first p-type semiconducting diamond layer. Namely, the B atom concentration in the diamond layer must be $1 \times 10^{19}$ $cm^{-3}$ or higher.

Regarding the substrate material on which the first diamond layer is formed, one can use semiconducting materials such as Si, BN and SiC, metals such as Mo, Cu and Ni, insulators such as quartz glass, aluminum oxide and silicon nitride, or diamond.

As for the diamond substrate, one can use either natural single crystal diamond or diamond made by high pressure synthesis. Polycrystalline or highly oriented diamond films can also be used. In view of manufacturing cost, polycrystalline or highly oriented diamond film is desirable. In view of quality, single crystal diamond or highly oriented diamond film is desirable.

Highly oriented diamond film means a diamond film formed on a non-diamond substrate by vapor-phase synthesis, wherein 60% or more of the surface area is constituted only of either (100) crystal face or (111) crystal face of diamond, and the difference $\{\Delta\alpha, \Delta\beta, \Delta\gamma\}$ in the Euler angle $\{\alpha, \beta, \gamma\}$ expressing the crystal orientation between the adjacent (100) or (111) crystal faces, must satisfy a relationship, $|\Delta\alpha|\leq 7°$, $|\Delta\beta|\leq 7°$, and $|\Delta\gamma|\leq 7°$.

Figure 5A:
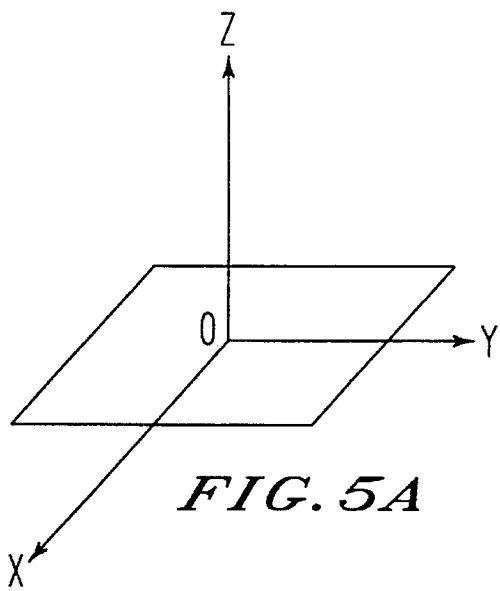
FIGS. 5A and 5B illustrate a structure of highly oriented diamond film.
Figure 5B:
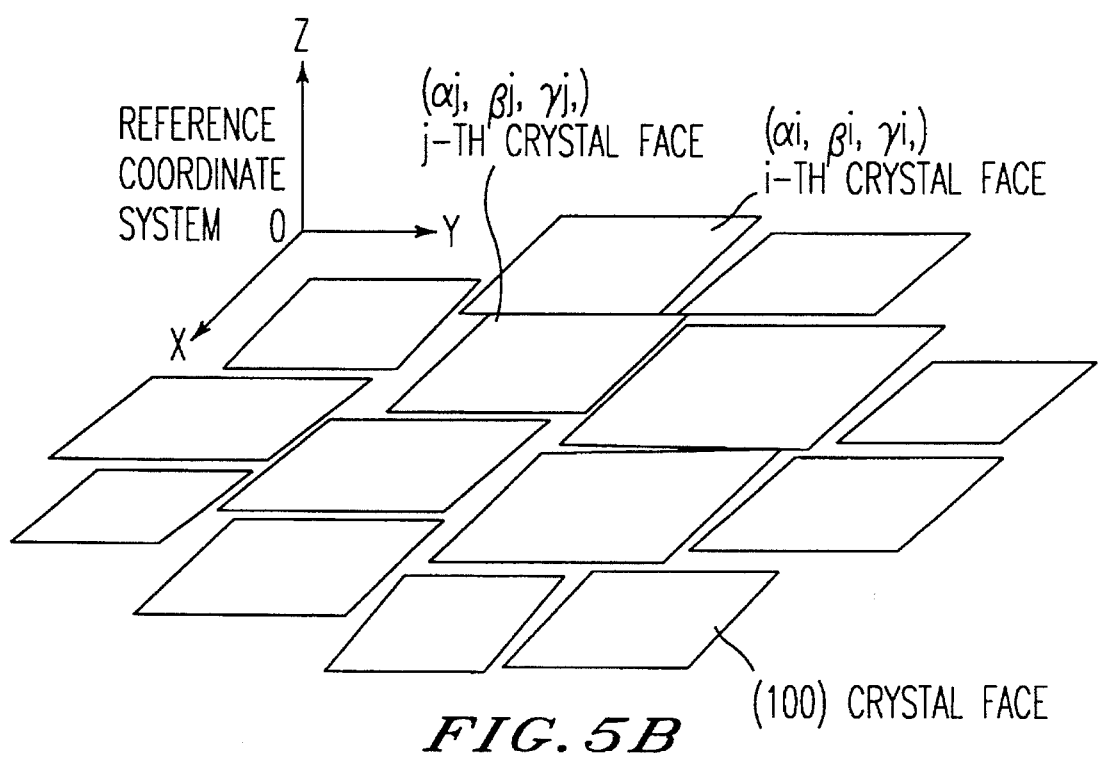

FIG. 5 illustrates a surface structure of a highly oriented diamond film in which (100) faces are aligned. The X-axis and Y-axis are defined within the film, and the direction normal to the film surface is defined as the Z-axis. The Euler angles, expressing the orientations of the i-th and the j-th diamond crystal faces adjacent to each other, are expressed by $\{\alpha_i, \beta_i, \gamma_i\}$ and $\{\alpha_j, \beta_j, \gamma_j\}$, respectively.

Figure 7:
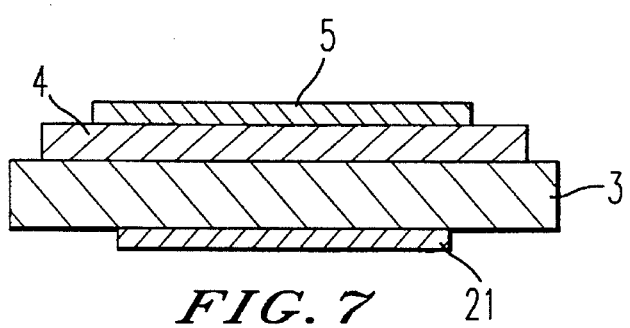
Figure 8:
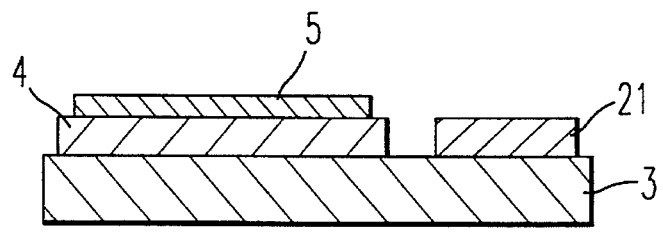

It should be noted that the diamond light-emitting element of the present invention is not limited to the structure shown in Example 1. Different structures of the diamond light-emitting element are shown in FIGS. 6 to 8.

Figure 6:
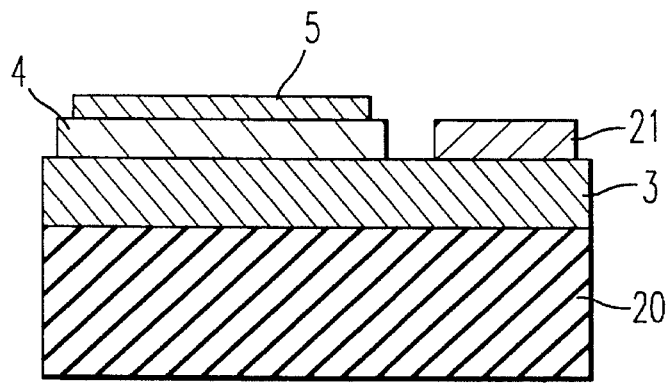
FIGS. 6 to 8 are cross sectional views of diamond light-emitting elements having different structures of the present invention.

FIG. 6 is a cross sectional view of a planar type diamond light-emitting element. The first diamond layer 3 was formed on the substrate 20 in the same manner as in the light-emitting element shown in FIG. 1. The second diamond layer 4 was selectively deposited on the first diamond layer 3 in the same manner as shown in FIG. 1. The electrode 5 was formed on the second diamond layer 4. An ohmic electrode 21 was formed on the first diamond layer 3 at a position separated from the second diamond layer 4.

When a voltage is applied between the ohmic electrode 21 and the second electrode 5, carriers (holes) are injected from the first diamond layer 3 to the second diamond layer 4 to cause light emission.

In the following, a diamond light-emitting element of another embodiment of the present invention is described with reference to FIG. 7: In the diamond light-emitting element of a vertical type, the first diamond layer 3 was initially formed on a substrate (not shown), and then the substrate was removed. An ohmic electrode 21 was formed under the first diamond layer 3. The second diamond layer was deposited on the first diamond layer 3, and the second electrode was formed thereon.

Like the example shown in FIG. 6, a voltage was applied between the ohmic electrode 21 and the second electrode 5, and carriers (holes) were injected from the first diamond layer 3 to the second diamond layer 4, resulting in light emission.

FIG. 8 is a cross sectional view of a planar-type diamond light-emitting element of another embodiment of the present invention. Like the example shown in FIG. 7, this diamond light-emitting element was also constructed in such a way that the diamond layer 3 initially deposited on a substrate (not shown) and then the substrate was removed. In this diamond light-emitting element, the second diamond layer 4 was selectively deposited on the upper surface of the first diamond layer 3. The electrode 5 was formed on the second diamond layer 4. The ohmic electrode 21 was separated from the second diamond layer 4 on the first diamond layer 3.

In the diamond light-emitting element of this example, a voltage was applied between the ohmic electrode 21 and the second electrode 5, and carriers (holes) were injected in the second diamond layer to result in light emission.

The inventive examples shown in FIGS. 6 to 8 have the same effect as that in Inventive Example 1 shown in FIG. 1. In the inventive examples in FIGS. 7 and 8, the light-emitting element is thin because the substrate has been removed.

Figure 9:
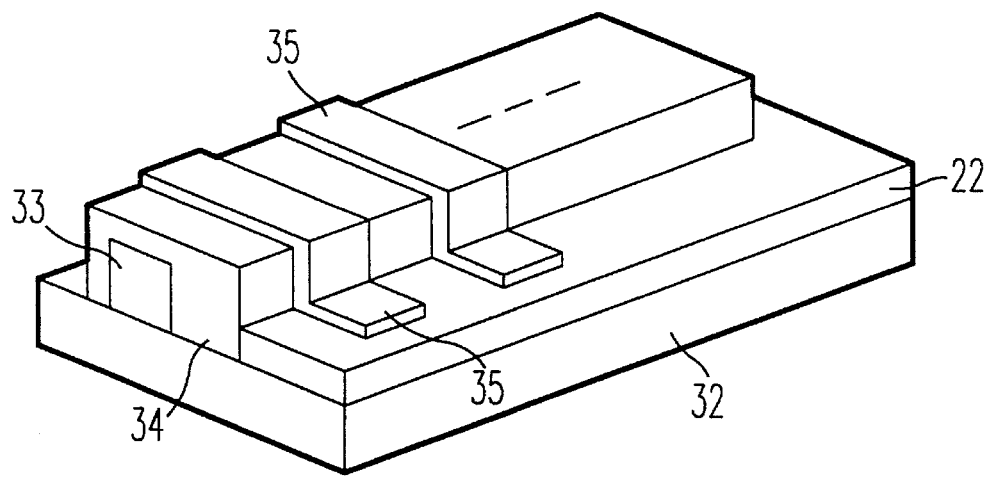
FIG. 9 is a perspective view of an example in which the present invention is applied to a primary display.

The diamond light-emitting elements according to the inventive examples may be integrated to make a primary or secondary display. FIG. 9 is a perspective view of a primary display. It was fabricated on a conductive substrate 32, and the first diamond layer 33 with a rectangular cross-section was extended in one direction. The second diamond layer was formed to cover the side surfaces of the first diamond layer 33.

An insulating layer 22 was formed on the conductive substrate 32 in contact with the second diamond layer 34. A plurality of transparent electrodes 35 were formed on the second diamond layer 34, perpendicularly to the second diamond layer 34. Note that one end portion of the transparent electrode 35 was extended on the insulating layer 22.

When a voltage was applied to the electrodes 35 of the primary display, each portion of the second diamond layer 34 under the electrode emitted light, thus activating the primary display.

Figure 10:
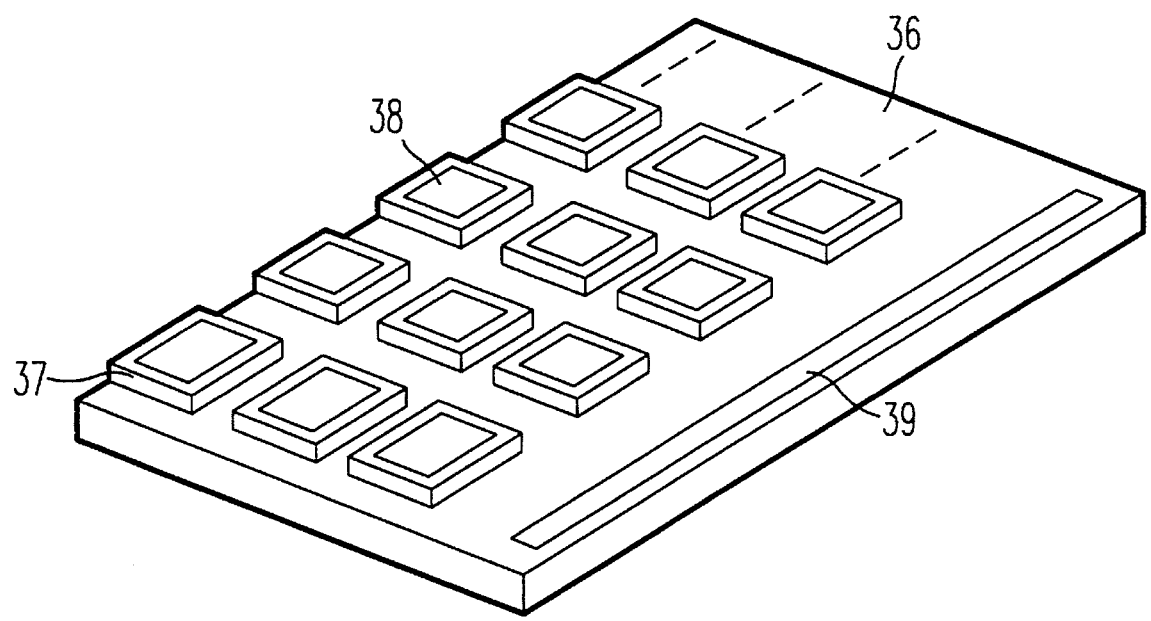
FIG. 10 is a perspective view of an example in which the present invention is applied to a secondary display.
Figure 11:
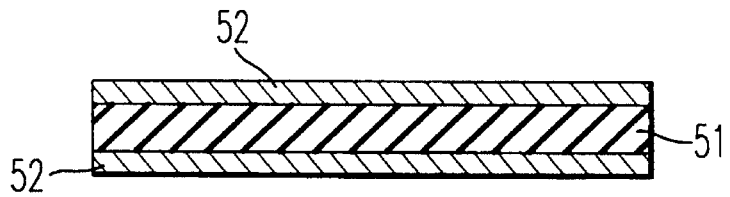
FIGS. 11 to 14 are cross sectional views of prior art diamond light-emitting elements having different EL structures.
Figure 12:
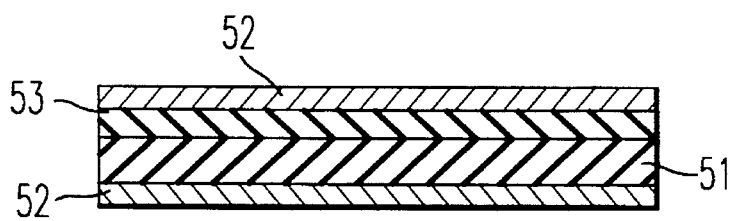
Figure 13:
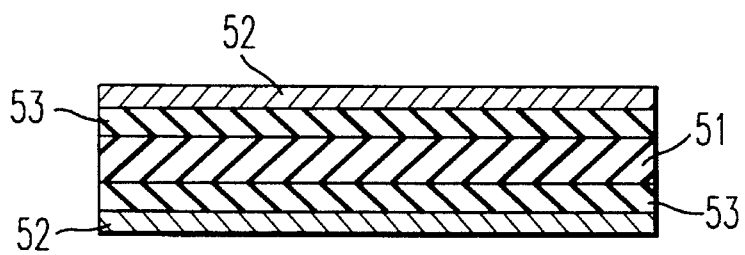
Figure 14:
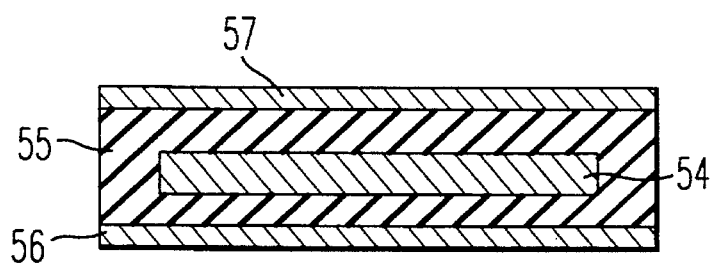
Figure 15:
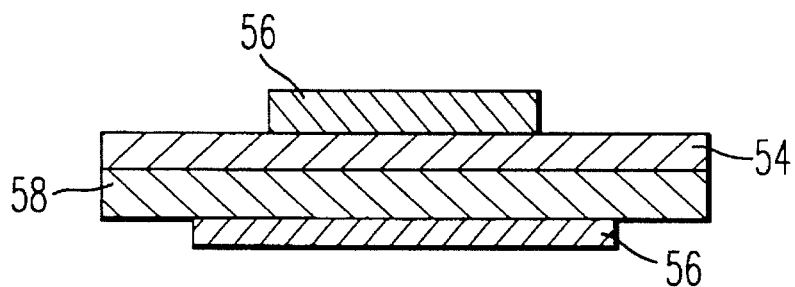
FIGS. 15 and 16 are cross sectional views of prior art diamond light-emitting elements having different MS structures.
Figure 16:
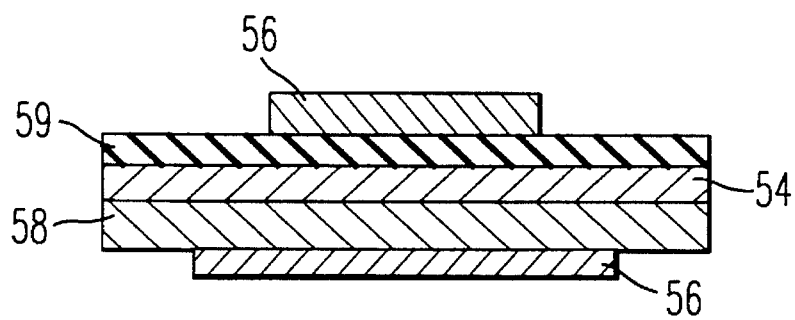
Figure 17:
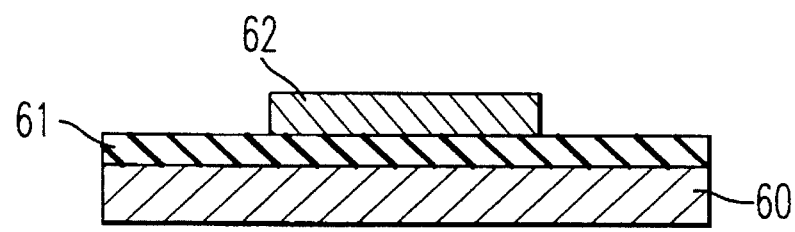
FIGS. 17 to 20 are cross sectional views of prior art diamond light-emitting elements having different MIS structures.
Figure 18:
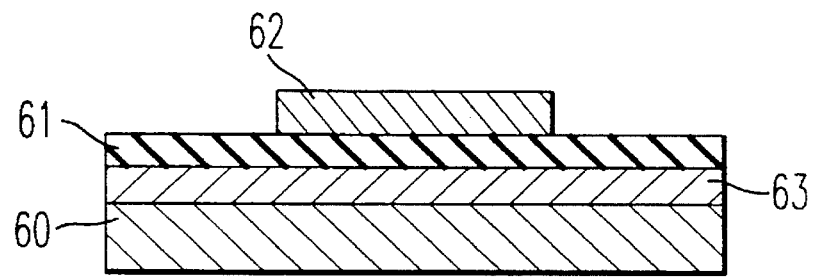
Figure 19:
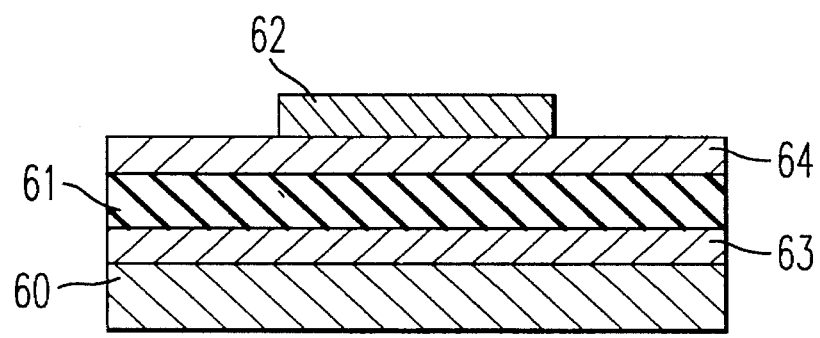
Figure 20:
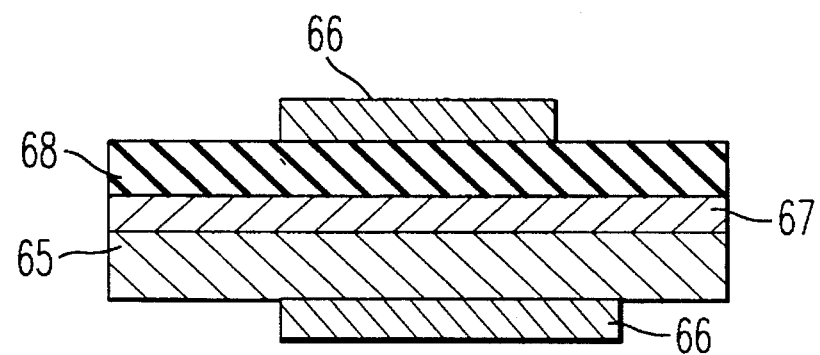

FIG. 10 is a perspective view of a secondary display. The secondary display was formed on a planar first diamond layer 36. An ohmic electrode 39 was formed on the first diamond layer 36 and extended along one direction. A plurality of second diamond layer 37 were arranged on the first diamond layer 36. The second diamond layers 37 of a square shape were selectively deposited on the first diamond layer 36. The transparent electrode 38 was then formed on the second diamond layer 37. The transparent electrodes 38 were connected to power supplies by wiring (not shown). When voltage was independently applied to each transparent electrode 38, the second diamond layer 37 was allowed to independently emit light, thus activating the secondary display.

As described above, according to the present invention, since the second diamond layer, contributing to light emission, has a crystal defect density in the range of $10^{11}$ cm$^{-2}$ or higher, a large number of electrons and holes recombine with each other by way of the defects. As a result, the diamond light-emitting element is capable of achieving light emission of high brightness at low operation voltage.

What is claimed is:

1. A diamond light-emitting element comprising:

a first semiconducting diamond layer;

a second semiconducting diamond layer deposited on said first semiconducting diamond layer; and first and second electrodes attached to said first and second semiconducting diamond layers, respectively, wherein said second semiconducting diamond layer has a crystal defect density of at least $10^{11}$ cm$^{-2}$.

2. A diamond light-emitting element according to claim 1, wherein said second semiconducting diamond layer is doped with at least one impurity selected from a group consisting of B, Li, Be, O, F, P, Si, N, As and Al.

3. A diamond light-emitting element according to claim 2, wherein a thickness of said second semiconducting diamond layer is in the range of 0.01 to 100 μm.

4. A diamond light-emitting element according to claim 3, wherein a concentration of boron atoms in said first semiconducting diamond layer is at least $10^{19}$ cm$^{-3}$.

5. A diamond light-emitting element according to claim 4, wherein said first electrode is in ohmic contact with said first semiconducting diamond layer.

6. A diamond light-emitting element according to claim 5, wherein said first semiconducting diamond layer is formed on a conductive substrate which is formed on said first electrode.

7. A diamond light-emitting element according to claim 6, wherein each of said first and second semiconducting diamond layers and said first and second electrodes are partially or entirely covered with a single structure or multi-structure of an insulating protective layer formed of at least one of a group consisting of undoped diamond, silicon oxide, aluminum oxide, boron nitride, silicon nitride, and aluminum nitride.

* * * * *